United States Patent
Thwaite et al.

(10) Patent No.: US 6,602,745 B2
(45) Date of Patent: Aug. 5, 2003

(54) FIELD EFFECT TRANSISTOR AND METHOD OF FABRICATION

(75) Inventors: Peter Thwaite, Beacon, NY (US); Jochen Beintner, Wappingers Falls, NY (US)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 10/066,206

(22) Filed: Jan. 31, 2002

(65) Prior Publication Data

US 2002/0094618 A1 Jul. 18, 2002

Related U.S. Application Data

(62) Division of application No. 09/662,692, filed on Sep. 14, 2000.

(51) Int. Cl.[7] ............................................. H01L 21/338
(52) U.S. Cl. ....................................... 438/182; 438/164
(58) Field of Search ................................. 438/157, 163, 438/164, 165, 182, 184, 296, 297, 318, 359, 362

(56) References Cited

U.S. PATENT DOCUMENTS 4,630,343 A  * 12/1986 Pierce et al.

* cited by examiner

*Primary Examiner*—David Nelms
*Assistant Examiner*—Phuc T. Dang
(74) *Attorney, Agent, or Firm*—Lerner, David, Littenberg, Krumholz & Mentlik, LLP

(57) ABSTRACT

An Insulated Gate Field Effect Transistor (IGFET), fabricated using Shallow Trench Isolation (STI), has an edge of a channel region of the IGFET which has a curved shape with a controlled radius of curvature so as to reduce the electric field at the edge of the channel region. A method of controlling the shape of the edge of the channel region is to limit the supply of oxygen to the region at the edge of the channel region during the oxidation process when the side walls of the silicon island, in which the transistor will be formed, are initially covered with a layer of silicon oxide.

18 Claims, 7 Drawing Sheets

SECT. AA

FIELD EFFECT TRANSISTOR AND METHOD OF FABRICATION

CROSS-REFERENCE TO RELATED APPLICATIONS

This is a division of U.S. application Ser. No. 09/662,692, filed on Sep. 14, 2000.

FIELD OF THE INVENTION

This invention relates to field effect transistors, and more particularly, to the shape of the channel region of a field effect transistor and a method of controlling the shape.

BACKGROUND OF THE INVENTION

The Insulated Gate Field Effect Transistor (IGFET) has become the workhorse of the semiconductor industry. Integrated circuits containing tens of millions of such IGFETs are routinely fabricated. In the design of such integrated circuits, it is necessary to know the characteristics of transistors with various widths and lengths of the channel region. IGFETs with very wide channel regions are typically used when relatively large currents are needed, such as driver transistors used to transmit signals to other devices exterior to the integrated circuit. Narrow channel IGFETS are typically used to transmit signals to a few, closely located transistors within an integrated circuit.

In the design of such integrated circuits it is important that the electrical characteristics of IGFETs with different channel sizes be known, and, if the electrical characteristics, such as threshold voltage, current drive capability, and sub-threshold leakage, are not identical, that the characteristics of transistors with different shape factors at least be quantifiable.

One of the effects which leads to transistors of different channel width having different characteristics is that the transistor characteristic at the edge of the channel may be different than the transistor characteristics at the center of a wide channel. If the channel of the transistor is very wide, the transistor characteristics will be dominated by the characteristics at the center of the channel. If the transistor is of a narrow width, the transistor characteristics may be dominated by the characteristics at the edge of the channel.

One parameter which can have a large influence on transistor characteristics is the magnitude of electric field in the gate insulator at the surface of the semiconductor. This electric field arises from the application of a potential to the gate electrode of the transistor relative to the body of the transistor. In the center of the channel region of a wide channel transistor this electric field is determined by the thickness and dielectric constant of the gate dielectric (insulator), and by the surface doping of the underlying semiconductor material. At the edge of the channel region, however, the shape of the edge of the semiconductor and the shape of the gate electrode, as well as the thickness of the gate dielectric, also influence the electric field at the surface of the semiconductor. In particular, if the edge of the semiconductor has a sharp corner with a small radius of curvature, the electric field for a given value of applied gate potential will be higher at this edge than in the central region of the channel. This can affect the characteristics of the IGFET in several ways.

The higher electric field at the edge of the channel region for a given gate potential can result in a premature turn-on of the IGFET, i.e., current will flow at the edge of the IGFET before current flow begins in the central portion of the IGFET. In effect, the threshold voltage at the edge of the IGFET is lower than that at the center thereof, and the effective threshold voltage of an IGFET is a function of the width of the channel. Deleterious circuit effects can occur when a potential is applied to the gate of a narrow channel IGFET which is of a magnitude sufficient to stop current flow in a wide channel IGFET, but which may be such as to allow significant current flow to take place in a narrow channel IGFET. Such an effect would manifest itself as an apparent increased sub-threshold leakage current in the narrow channel IGFETs used in the circuit.

Physically deleterious effects may also occur if the increase of electric field in the gate insulator at the edge of the channel of the IGFET, for a given applied gate potential, is excessive, and results in the electric field exceeding the maximum allowable electric field to prevent breakdown of the gate insulator material. Such excessive electric field in the gate insulator material may result in reduced reliability of the transistors.

FIG. 1 shows a sectional view of a channel region of a prior art IGFET fabricated in a Shallow Trench Isolation (STI) technology. A silicon island 14, having a channel portion 14b, is formed in a semiconductor body 12, which is typically silicon. Channel portion 14b has a top surface 14bb. Surrounding the island 14 is an insulating region 16 that has a lower surface 16b in contact with portions of the silicon body 12, and has side walls 16c in contact with side walls 14bbb of island 14. A top surface 16a of insulating region 16 is at a level above the top surface 14bb of channel region 14b. Insulating region 16 has been formed using Shallow Trench Isolation (STI) techniques. A gate insulator layer 18 (dielectric layer) having an upper surface 18a is on the upper surface 14bb of the channel region 14b. A gate region 20 lies on the upper surfaces 18a and 16a of the insulating regions 18 and 16, respectively. Gate region 20 overlies and typically extends beyond channel region 14b. The gate region 20 is typically doped polysilicon, but can be a material of greater conductivity, such as aluminum, or a metal silicide, such as tungsten silicide, or a composite layer composed of a metal silicide layer and a layer of polysilicon. The corners 30 of the channel region 14b, defined by the intersection of side walls 14bbb and top surface 14bb, are shown as right angles, with little or no radius of curvature. The sharp corners 30 are characteristic of transistors fabricated using prior art techniques, and lead to higher electric fields in the gate insulator 18 in the vicinity of the sharp corners 30 than in the center 31 of the channel region. Such a transistor will suffer from the deleterious effects described above.

It has been found in the prior art that the radius of the corners 30 may be increased, and the electric fields in the gate insulator 18 in the vicinity of the sharp corners 30 reduced, by increasing the thickness of various sacrificial oxide layers used in the fabrication of the prior art structure shown in FIG. 1. The use of such thicker oxide layers will require an increased "time at temperature" during the fabrication of the structure, which results in undesirable dopant diffusion. Thus, one achieves the reduction of one deleterious effect, high electric fields in the gate insulator, but at the price of another deleterious effect, increased dopant diffusion.

Other prior art attempts to increase the radius of the corners 30 result in the top surface 14bb of the channel region 14b being non-planar. This can lead to undesirable physical or electrical characteristics of the transistors formed. Still other prior art attempts to increase the radius of the corners 30 result in the formation of shallow trenches in the STI insulating region 16 adjacent to the side walls 14*bbb* of the silicon island 14. This can lead to undesirable electrical characteristics of the transistors formed, or difficulties in later processing steps.

It is desirable to fabricate the IGFETs in such a manner that as few as possible deleterious effects take place at the edges of the channels thereof, and throughout the complete IGFET structure.

SUMMARY OF THE INVENTION

The present invention is directed to an Insulated Gate Field Effect Transistor (IGFET) in which a region of a semiconductor channel region of the IGFET is shaped so as to reduce the electric field in the gate insulator resulting from a given applied gate potential, and to a method for fabricating an IGFET so as to result in the elimination of sharp corners of semiconductor at the edge of the channel region of the IGFET.

Viewed from a first process aspect, the present invention is directed to a method for forming a curved edge on a semiconductor island. The method comprises the step of oxidizing the exposed surface of the silicon, with a supply of oxygen to a portion of said surface being restricted by a structure surrounding the surface of the exposed silicon, to form said curved edge.

Viewed from a second process aspect, the present invention is directed to a method for modifying the shape of a gate insulator region and an underlying edge of a channel region of a field effect transistor so as to provide a curved shape to the silicon at the edges of the channel region. The method comprises the steps of: forming on the surface of a silicon body a layer of silicon oxide covered by a layer of silicon nitride; patterning the silicon nitride to form regions where transistors will be formed; etching exposed portions of silicon oxide and the underlying silicon, leaving at least one raised island of silicon with a layer of silicon oxide and a layer of silicon nitride on the surface of the silicon where the transistor is to be formed; etching the semiconductor body to remove the silicon oxide layer under the silicon nitride layer at the periphery of the silicon island to leave a lip of silicon nitride which, in subsequent steps, restricts the access of oxygen to the underlying silicon surface; oxidizing the semiconductor body to form a layer of silicon oxide on the surface of exposed silicon, said layer of silicon dioxide extending underneath the periphery of said silicon nitride, wherein said oxidation of exposed silicon occurs more rapidly at the exposed corners of the silicon island and results in a rounding of said corners; and etching the silicon nitride layer to recess it away from the edge of the channel region.

Viewed from a third process aspect, the present invention is directed to a method of forming a semiconductor island having a top surface and side walls with an intersection of the top surface and the side walls being a curved surface. The method comprises the steps of: forming over the top surface of the semiconductor island a layer of material which leaves a gap between same and a peripheral portion of the top surface near the intersection of the top surface and the side walls so as to restrict oxygen flow into this portion of the top surface; and oxidizing all exposed portions of the semiconductor island so as to create a curved surface at an intersection of the side walls and the top surface thereof.

Viewed from a fourth process aspect, the present invention is directed to a method of forming a semiconductor island having a top surface and side walls with an intersection of the top surface and the side walls being a curved surface. The method comprises the steps of: forming over the top surface of the semiconductor island a layer of material which has a T-like shape with the periphery of the top surface near the intersection of the top surface and the side walls being separated from a top portion of the T-like shaped material so as to restrict oxygen flow into this portion of the top surface; oxidizing all exposed surfaces of the semiconductor island so as to create a curved surface at an intersection of the side walls and the top surface thereof; and etching the silicon nitride layer to recess it away from the edge of the channel region.

Viewed from a fifth process aspect, the present invention is directed to a method of forming a semiconductor island having a top surface and side walls with an intersection of the top surface and the side walls being a curved surface. The method comprises the steps of: forming a silicon oxide layer over the top surface of the semiconductor island; covering said oxide layer with layer of silicon nitride; removing a portion of the silicon oxide layer around the periphery of the top surface of the semiconductor island to leave a gap between the silicon nitride layer and a portion of the top surface of the semiconductor island; oxidizing all exposed portions of the semiconductor island so as to create a curved surface at an intersection of the side walls and the top surface thereof; and etching the silicon nitride layer to recess it away from the edge of the channel region.

Viewed from a sixth process aspect, the present invention is directed to a method of forming a portion of each of a plurality of field effect transistors on a silicon body with the transistors being electrically isolated from each other by shallow trench isolation, each transistor being formed in and on an island of silicon having a top surface and side walls. The method comprises the steps of: forming a silicon oxide layer over the top surface of each island; covering each oxide layer with a layer of silicon nitride; removing a portion of the silicon oxide layer around the periphery of the top surface of the silicon island to leave a gap between the silicon nitride layer and a portion of the top surface of the silicon island; oxidizing all exposed portions of the silicon island so as to round corners of the silicon island at an intersection of the side walls and the top surface thereof; and etching the silicon nitride layer to recess it away from the edge of the channel region.

The invention will be better understood from the following more detailed description in conjunction with the accompanying drawing and claims.

Figure 1:
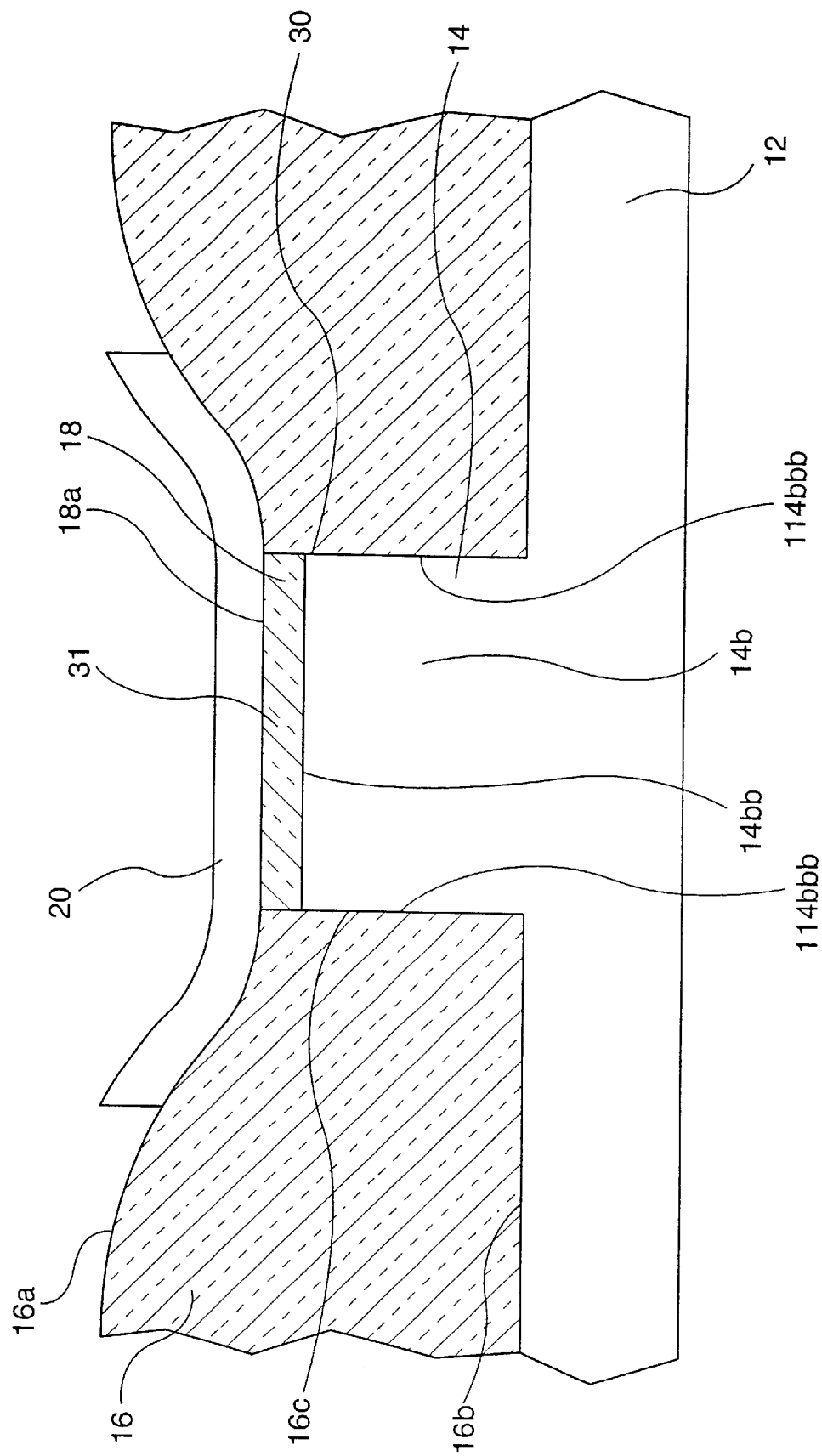
FIG. 1 shows a sectional view of part of a prior art Insulated Gate Field Effect Transistor (IGFET)

The drawing is not necessarily to scale.

DETAILED DESCRIPTION OF THE INVENTION

It is the purpose of this invention to produce an Insulated Gate Field Effect Transistor (IGFET) structure in which the shape of the semiconductor channel region at an edge thereof is controlled so as to control the electric field in the gate insulator in this region. Such a transistor has a well defined threshold voltage, a reduced amount of subthreshold leakage current, and a reduced failure rate due to gate insulator breakdown effects.

Figure 2:
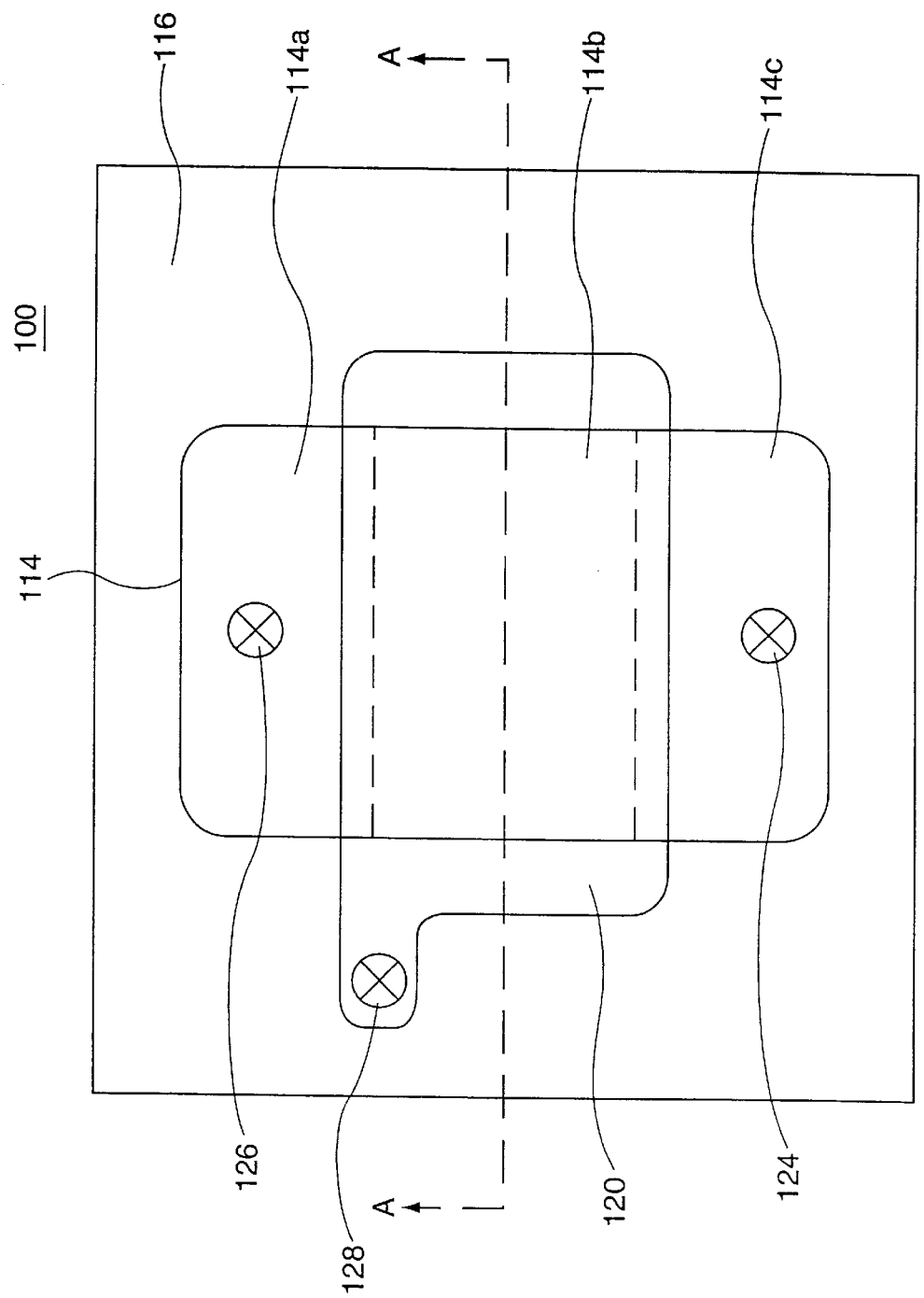
FIG. 2 shows a top view of an Insulated Gate Field Effect Transistor fabricated in accordance with the present invention.

FIG. 2 shows a top view of an Insulated Gate Field Effect Transistor (IGFET) fabricated in a semiconductor structure 100 in accordance with the present invention. Components of the IGFET of FIGS. 2 and 3 which correspond to those of FIG. 1 have the same reference number with 100 added thereto. The transistor is fabricated in a semiconductor island 114, typically silicon, which is surrounded by an insulating region 116 which is illustratively fabricated using Shallow Trench Isolation (STI) technology. The insulating region 116 serves to isolate the transistor from neighboring transistors (not shown). The silicon island 114 consists of a source portion 114a, a channel portion 114b, and a drain portion 114c. A top surface of the silicon island 114 is covered by a gate insulator layer 118, not shown in FIG. 2 but shown in FIG. 3. Overlying layer 118 and extending beyond the channel region 114b is a gate electrode 120. Electrical contact to the drain 114c and source 114a portions of the silicon island 114 is made at contact regions 124 and 126, respectively, which are shown symbolically. Electrical contact to the gate electrode 120 is made at gate contact region 128 which is shown symbolically.

Figure 3:
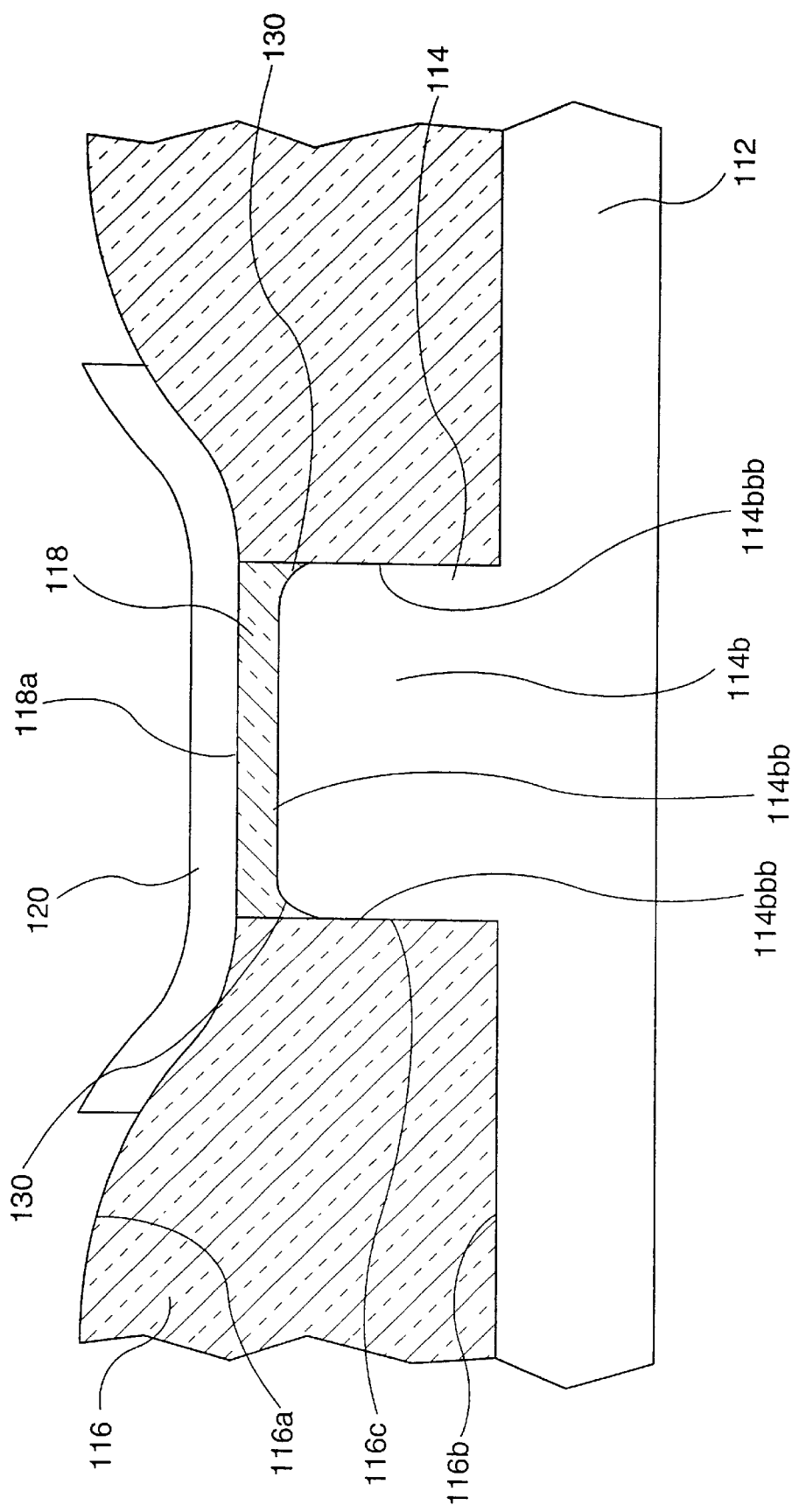
FIG. 3 shows a sectional view of an Insulated Gate Field Effect Transistor fabricated in accordance with the present invention.

FIG. 3 shows a sectional view of the transistor of FIG. 2 at a plane shown by a dashed line A—A, which is through the channel portion 114b of the transistor. A silicon island 114 having a channel portion 114b is formed in a semiconductor body 112, which is typically silicon. Channel portion 114b has a top surface 114bb. Surrounding the island 114 is an insulating region 116 that has a lower surface 116b in contact with portions of the silicon body 112, and has side walls 116c in contact with the side walls 114bbb of the island 114. A top surface 116a of insulating region 116 is at a level above the top surface 114bb of channel region 114b. Insulating region 116 is typically formed using Shallow Trench Isolation (STI) techniques. A gate insulator layer 118 (dielectric layer) having an upper surface 118a is on the upper surface 114bb of the channel region 114b. A gate region 120 lies on the upper surfaces 118a and 116a of the insulating regions 118 and 116, respectively. Gate region 120 overlies and typically extends beyond channel region 114b. The gate region 120 is typically doped polysilicon, but can be a material of greater conductivity, such as aluminum, or a metal silicide, such as tungsten silicide, or a composite layer composed of a metal silicide layer and a layer of polysilicon. The structure of FIG. 3 has been fabricated using methods of the present invention, which are described below, to ensure that corners 130 of the channel region 114b, defined by the intersection of the side walls 114bbb and top surface 114bb, adjacent to the gate insulator 118 are of a curved shape, with a radius of curvature controlled by the parameters of the process methods of the present invention.

Figure 4:
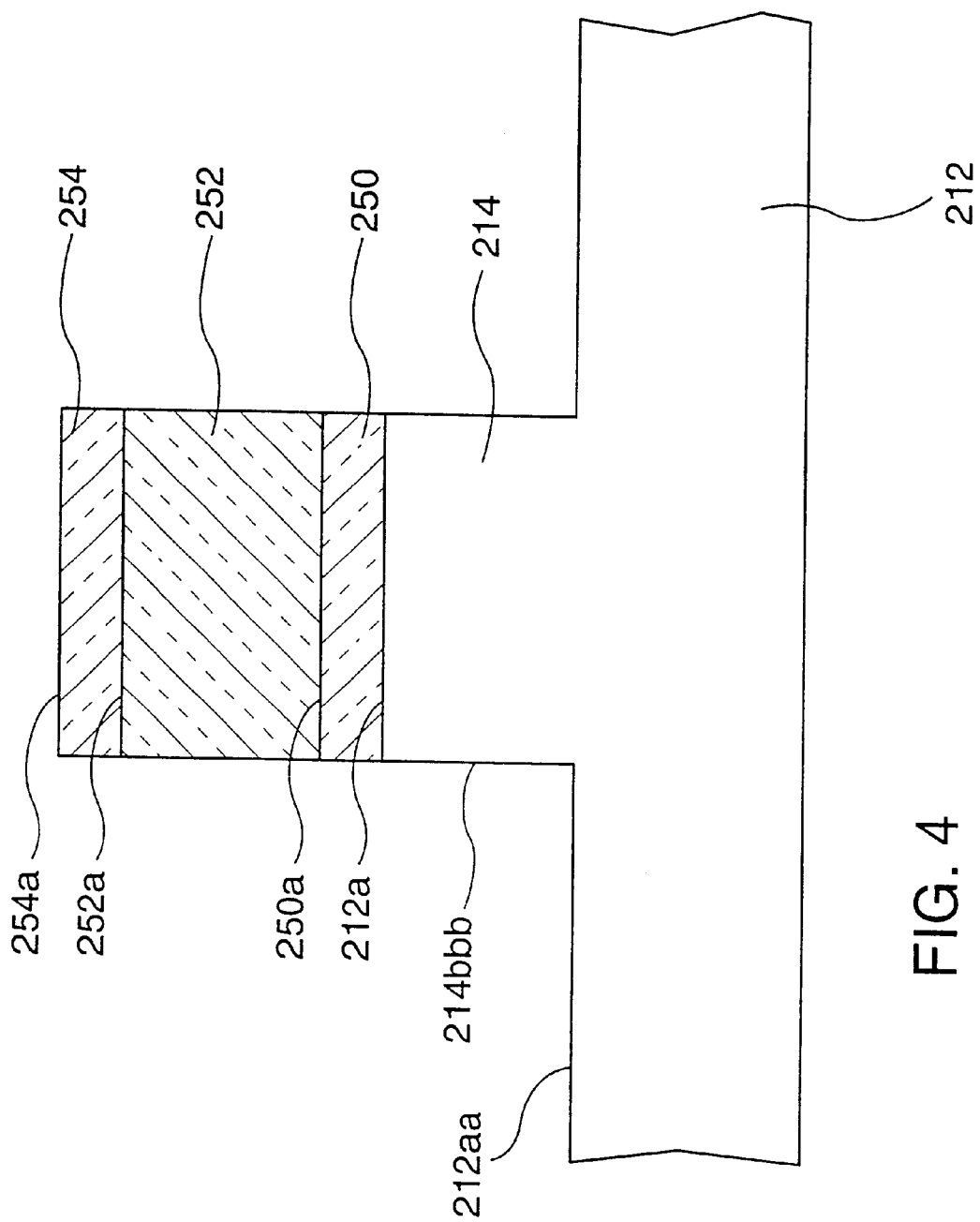
FIGS. 4, 5, 6 and 7 show the structure of FIG. 3 at various points in the fabrication process.

FIG. 4 shows a sectional view of the transistor of FIG. 2 at an early stage in a fabrication sequence in accordance with the present invention. A semiconductor body 212, typically silicon, having a top surface 212a has had formed on the top surface 212a thereof a layer 250 of silicon oxide having a top surface 250a. In an illustrative embodiment the thickness of layer 250 is 4–5 nm. The thickness of the layer 250 is a parameter which is varied to optimize the shape of the final structure, and has been varied over the range of at least 3 to 10 nm. A layer 252 of silicon nitride having a top surface 252a has been deposited on the top surface 250a of the silicon oxide layer 250. In an illustrative embodiment layer 252 has a thickness of 100 nm. A layer of photoresist 254 having a top surface 254a has been deposited on the top surface 252a of silicon nitride layer 252. The photoresist layer 254 has been patterned to define regions where silicon islands 214 are to be formed, leaving developed photoresist in those regions. The resulting exposed portion of silicon nitride layer 252 is then etched, with the etching process continuing through the resulting exposed portion of the silicon oxide layer 250, and continuing through the resulting exposed portion of semiconductor body 212, to form an island 214 with side walls 214bbb, and exposing a second lower top surface 212aa of semiconductor body 212. In an illustrative embodiment the silicon semiconductor body 212 is etched to a depth between 100 and 400 nm. The photoresist layer 254 is then removed. This leaves the silicon nitride layer 252 and the silicon oxide layer 250 on the top surface 212a of the island 214. The above is accomplished using known masking and etching technologies.

Figure 5:
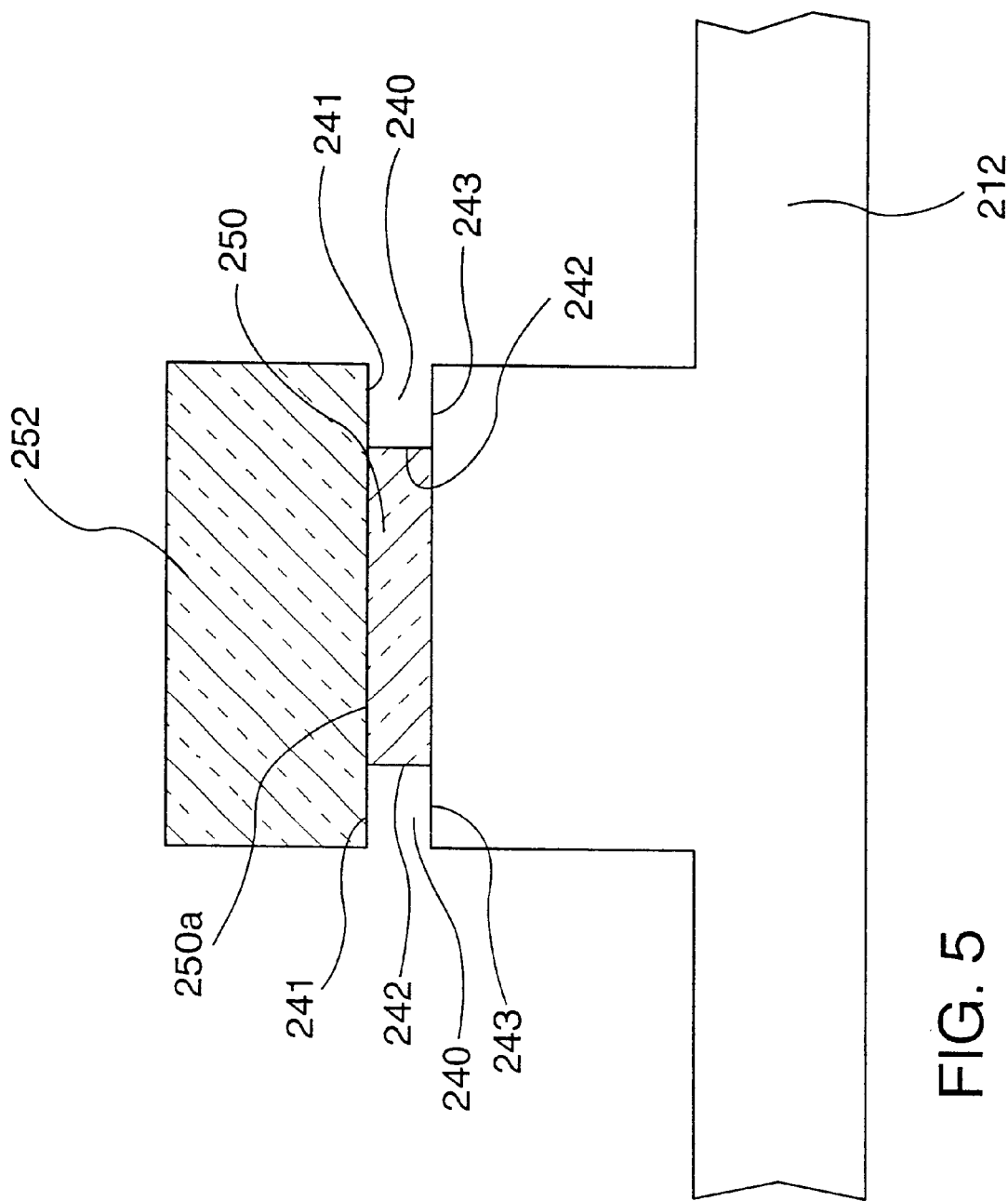

FIG. 5 shows the structure of FIG. 4 after the completion of the next step in the process sequence to form an undercut region 240 formed on three sides by a lower surface 241 of the silicon nitride layer 252, a side surface 242 of the silicon oxide layer 252, and a top surface 243 of the island 214. Layer 252 and layer 250 form a "T"-like structure with layer 252 being the top of the "T". The structure of FIG. 4, after the removal of photoresist layer 254, is exposed to an etchant to etch the silicon oxide layer 250, removing, at the periphery of the island 214, a portion of layer 250 under the silicon nitride layer 252. The amount of silicon oxide layer 250 which is removed at this point is a parameter which is varied to optimize the shape of the final structure.

Figure 6:
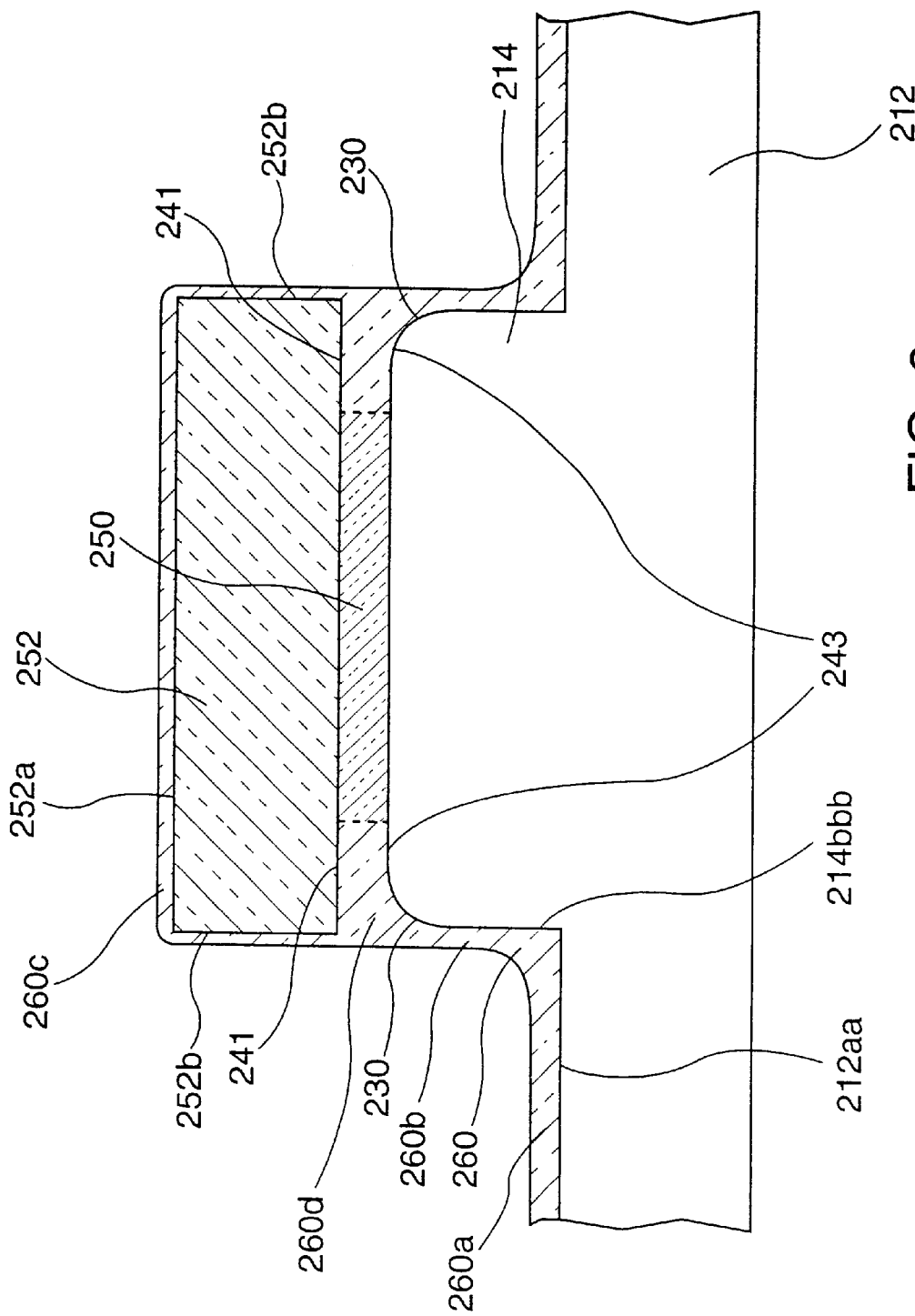

FIG. 6 shows the structure of FIG. 5 after it has been exposed to an oxidizing ambient to form a layer 260, which comprises portions 260a, 260b, 260c, and 260d, of silicon oxide on various exposed surfaces of the semiconductor structure. The layer 260a is formed on the openly exposed surfaces 212aa of the silicon semiconductor substrate 212. The layer 260b is formed on side walls 214bbb of silicon island 214. The layer 260c is formed on the surface 252a and on the side walls 252b of the silicon nitride layer. In an illustrative embodiment, layer 260a has a thickness of 5–20 nm, and layer 260c has a thickness of 1–2 nm. The region 260d is also formed on surface 241 of silicon nitride layer 252 and on surface 243 of silicon island 214. Region 260d fills undercut region 240 (shown in FIG. 5). It is thought that the supply of oxygen to the interior portions of undercut region 240 becomes limited as the undercut region 240 fills with silicon oxide, and the oxygen is forced to diffuse through the silicon oxide in region 240 before it can reach the silicon to form additional silicon dioxide. This limitation of the supply of oxygen to the interior of the undercut region 240 is thought to affect the final shape of corners 230 of the silicon island 214. The final shape of the corners 230, resulting from the use of the methods of this invention, is of a greater radius of curvature than results when prior art methods are used.

An oxide etch is then used to remove the layer 260c of silicon oxide on the surface 252a and side walls 252b of the silicon nitride layer 250. In an illustrative embodiment, an oxide etch such as HF/Glycerol is used to perform this process step. This etch will also remove a portion of layer 260, resulting in the layers 260aa, 260bb, and 260dd of FIG. 7.

Figure 7:
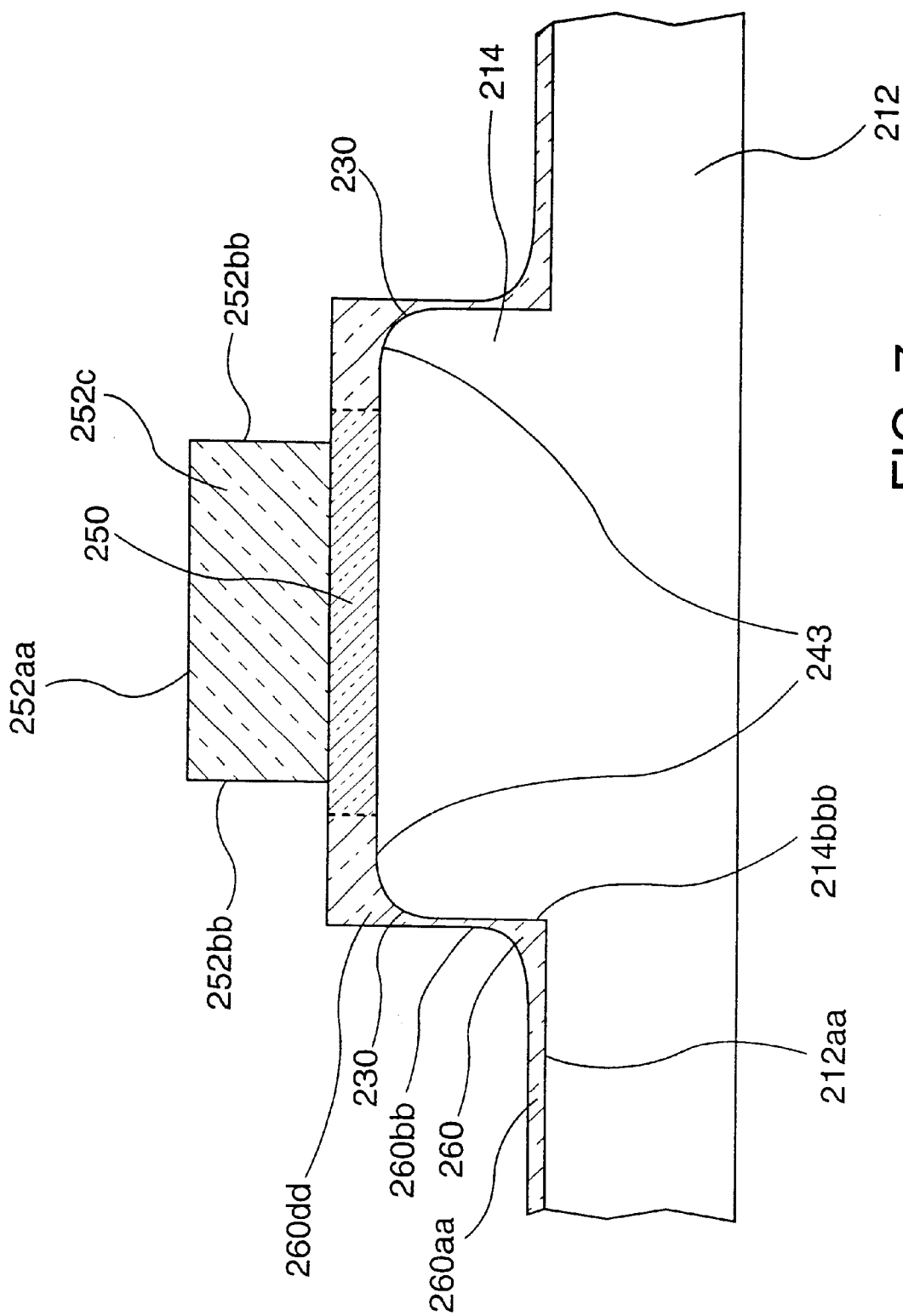

FIG. 7 shows the structure of FIG. 6 after the completion of the next step in the process sequence to etch away a portion of, or "pullback", the silicon nitride layer 252. This results in a new top surface 252aa and new side walls 252bb of the remaining portion 252c of the original silicon nitride layer 252. In an illustrative embodiment, an etch such as hot phosphoric acid which selectively etches silicon nitride, is used to perform this process step. In the illustrative embodiment, the new side walls 252bb of the remaining silicon nitride layer 252c is 20 to 30 nm removed from the side wall 214bbb of the silicon island 214.

Following this, prior art methods of forming the STI oxide 116 (shown in FIGS. 2 and 3), forming source and drain regions 114a and 114c (shown in FIG. 2), removing remaining silicon nitride layer 252 and silicon oxide layer 250 (shown in FIGS. 4, 5, and 6), forming gate insulator region 118 (shown in FIG. 3), and forming gate electrode region 120 (shown in FIGS. 2 and 3), are used to form the improved device shown in FIGS. 2 and 3.

IGFET structures have been fabricated using both the prior art techniques and the innovative techniques of the present invention, while maintaining all other process steps and parameters to be the same. It has been observed that the use of the innovative techniques of the present invention results in an increase of 50% from the radius of the prior art corner 30 to the radius of the corner 130 fabricated using the principles taught in the present invention. The prior art structure was found to have a radius of 4 nm, and the structure fabricated using the principles taught in the present invention was found to have a radius of 6 nm. The 50% increase in radius of the corners 130 is obtained without deleterious loss of planarity of the top surface 114bb of the channel region 114b, or the introduction of trenches in the insulating region 116 adjacent to the side walls 114bbb of the channel region 114b, as has been observed in prior art attempts to increase the radius of the prior art corners 30.

It can be readily appreciated that the specific embodiment described is merely illustrative of the basic principles of the invention and that various other embodiments may be devised without departing from the spirit and novel principles of the invention. It can be readily appreciated that the specific process steps and sequence of said process steps is merely illustrative of the basic principles of the invention, and that various other steps may be devised, and the sequence of said process steps may be modified, without departing from the spirit and novel principles of the invention. For example, the edges of the channel regions of junction field effect transistors, bipolar field effect transistors, and vertical metal-oxide-semiconductor transistors can be fabricated using the methods of the present invention. Still further, while the structure and method are described in the context of fabricating a single Insulated Gate Field Effect Transistor, the method may be applied to fabricating a plurality of field effect transistors with a single type of channel conductivity, to fabricating a plurality of field effect transistors with complementary channel conductivity, or to fabricating integrated circuits using utilizing any combination of n or p-channel transistors and npn or pnp bipolar transistors. Furthermore, the method may be applied to fabricating integrated circuits using semiconductor materials other than silicon, such as gallium arsenide or silicon-germanium.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A method of forming a semiconductor island having a top surface and side walls with an intersection of the top surface and the side walls being a curved surface, said method comprising the steps of:

forming over the top surface of the semiconductor island a layer of material which has a T-like shape with the periphery of the top surface near the intersection of the top surface and the side walls being separated from a top portion of the T-like shaped material so as to restrict oxygen flow into this portion of the top surface;

oxidizing all exposed surfaces of the semiconductor island so as to create a curved surface at an intersection of the side walls and the top surface thereof; and etching the top portion of the T-like shaped material to recess it away from said side walls of the semiconductor island.

2. The method of claim 1 wherein said step of forming a layer of material includes:

forming, on a surface of a semiconductor body, a layer of silicon oxide;

forming, on said layer of silicon oxide, a layer of silicon nitride;

patterning and etching said layer of silicon nitride to expose portions of said layer of silicon oxide;

etching said exposed portions of said layer of silicon oxide and portions of said semiconductor body underlying said exposed portions of said layer of silicon oxide to form said semiconductor island with a remaining portion of said layer of silicon oxide and a remaining portion of said layer of silicon nitride on said top surface of said semiconductor island; and etching said remaining portion of said layer of silicon oxide at the periphery of said top surface of said semiconductor island such that said remaining portion of said layer of silicon nitride and said remaining portion of said layer of silicon oxide comprise a structure having said T-like shape.

3. The method of claim 2, wherein said top portion of the T-like shaped material is a material which is impervious to the diffusion of oxygen.

4. The method of claim 2, wherein said top portion of the T-like shaped material is silicon nitride.

5. The method of claim 2, wherein said step of etching the top portion of the T-like shaped material comprises etching said remaining portion of said layer of silicon nitride to recess it away from said side walls of said semiconductor island.

6. The method of claim 1 wherein a further layer of silicon oxide is formed on said exposed surfaces of said semiconductor island during said oxidizing step, said further layer of silicon oxide extending underneath said top portion of the T-like shaped material, said oxidation of said exposed surfaces of said semiconductor island occurring more rapidly at said intersection of said side walls and said top surface of said semiconductor island, thereby creating said curved surface.

7. The method of claim 1 wherein said oxidizing step forms a further layer of silicon oxide on said top portion of the T-like shaped material; said method further comprising etching the further layer of silicon oxide from said top portion of the T-like shaped material prior to said step of etching the top portion of the T-like shaped material.

8. The method of claim 1 wherein a top portion of said semiconductor island comprises a channel region of a field effect transistor, and a lower portion of the T-like shaped material comprises a gate insulator region, said method further comprising forming source and drain regions in the side walls of said semiconductor island, removing said top portion of said T-like shaped material, and forming a gate electrode atop said gate insulator region.

9. A method of forming a semiconductor island having a top surface and side walls with an intersection of the top surface and the side walls being a curved surface, said method comprising the steps of:

forming a silicon oxide layer over a top surface of a semiconductor substrate;

covering said silicon oxide layer with a layer of silicon nitride;

removing portions of said layer of silicon nitride, said silicon oxide layer and said semiconductor substrate to form said semiconductor island with a remaining portion of said silicon oxide layer and a remaining portion of said layer of silicon nitride on said top surface of said semiconductor island;

removing a further portion of the silicon oxide layer around the periphery of the top surface of the semiconductor island to leave a gap between the silicon nitride layer and a portion of the top surface of the semiconductor island;

oxidizing all exposed portions of the semiconductor island so as to create a curved surface at an intersection of the side walls and the top surface thereof; and etching the silicon nitride layer to recess it away from said side walls of the semiconductor island.

10. The method of claim 9 wherein said removing step includes patterning and etching said layer of silicon nitride to expose portions of said silicon oxide layer, and etching said exposed portions of said silicon oxide layer and portions of said semiconductor body underlying said exposed portions of said layer of silicon oxide to form said semiconductor island.

11. The method of claim 9 wherein a further layer of silicon oxide is formed on said exposed surfaces of said semiconductor island during said oxidizing step, said further layer of silicon dioxide extending underneath said layer of silicon nitride, said oxidation of said exposed surfaces of said semiconductor island occurring more rapidly at said intersection of said side walls and said top surface of said semiconductor island, thereby resulting in said curved surface.

12. The method of claim 9 wherein a further layer of silicon oxide is formed on a top surface and sidewalls of said layer of silicon nitride during said oxidizing step; said method further comprising etching the further layer of silicon oxide from said top surface and said sidewalls of said layer of silicon nitride prior to said step of etching the silicon nitride layer.

13. The method of claim 9 wherein a top portion of said semiconductor island comprises a channel region of a field effect transistor, and said oxide layer comprises a gate insulator region, said method further comprising forming source and drain regions in the side walls of said semiconductor island, removing said layer of silicon nitride, and forming a gate electrode atop said gate insulator region.

14. A method of forming a portion of each of a plurality of field effect transistors on a silicon body with the transistors being electrically isolated from each other by shallow trench isolation, each transistor being formed in and on an island of silicon having a top surface and side walls, said method comprising the steps of:

forming a silicon oxide layer over a top surface of a silicon substrate;

covering the silicon oxide layer with a layer of silicon nitride;

removing portions of said layer of silicon nitride, said silicon oxide layer and said semiconductor substrate to form a plurality of silicon islands each with a remaining portion of said silicon oxide layer and a remaining portion of said layer of silicon nitride on its top surface;

removing a further portion of the silicon oxide layer around the periphery of the top surface of said each silicon island to leave a gap between the silicon nitride layer and a portion of the top surface of said each silicon island; oxidizing all exposed portions of said each silicon island so as to round corners of said each silicon island at an intersection of the side walls and the top surface thereof; and etching the silicon nitride layer to recess it away from said side walls of said each silicon island.

15. The method of claim 14 wherein said removing step includes patterning and etching said layer of silicon nitride to expose portions of said silicon oxide layer, and etching said exposed portions of said silicon oxide layer and portions of said silicon body underlying said exposed portions of said layer of silicon oxide to form said plurality of silicon islands.

16. The method of claim 14 wherein a further layer of silicon oxide is formed on said exposed surfaces of said semiconductor island during said oxidizing step, said further layer of silicon dioxide extending underneath said layer of silicon nitride, said oxidation of said exposed surfaces of said semiconductor island occurring more rapidly at said intersection of said side walls and said top surface of said semiconductor island, thereby resulting in said curved surface.

17. The method of claim 14 herein a further layer of silicon oxide is formed on a top surface and sidewalls of said layer of silicon nitride during said oxidizing step; said method further comprising etching the further layer of silicon oxide from said top surface and said sidewalls of said layer of silicon nitride prior to said step of etching the silicon nitride layer.

18. The method of claim 14 wherein a top portion of said each semiconductor island comprises a channel region of a respective one of said plurality of field effect transistors, and said oxide layer comprises a plurality of gate insulator regions, said method further comprising forming source and drain regions in the side walls of said each semiconductor island, removing said layer of silicon nitride, and forming a gate electrode atop each of said plurality of gate insulator regions.

* * * * *